US008030680B2

(12) United States Patent
Kim

(10) Patent No.: US 8,030,680 B2

(45) Date of Patent: Oct. 4, 2011

(54) NITRIDE SEMICONDUCTOR LIGHT-EMITTING DEVICE AND METHOD FOR MANUFACTURING THE SAME

(75) Inventor: Tae-Yun Kim, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 222 days.

(21) Appl. No.: 11/705,433

(22) Filed: Feb. 13, 2007

(65) Prior Publication Data

US 2007/0187713 A1 Aug. 16, 2007

(30) Foreign Application Priority Data

Feb. 14, 2006 (KR) ........................ 10-2006-0014090

(51) Int. Cl.
*H01L 33/00* (2010.01)

(52) U.S. Cl. .. 257/101; 257/102; 257/103; 257/E33.017

(58) Field of Classification Search .................. 257/101, 257/103, E33.008, 79, 102, E33.017, E33.023
See application file for complete search history.

(56) References Cited

U.S. PATENT DOCUMENTS 6,229,160 B1 * 5/2001 Krames et al. .................. 257/94
6,459,096 B1 * 10/2002 Razeghi .......................... 257/14
6,936,488 B2 * 8/2005 D'Evelyn et al. ............... 438/22
7,268,371 B2 * 9/2007 Krames et al. .................. 257/98
7,303,969 B2 * 12/2007 Berger et al. ................. 438/380
2005/0230690 A1 * 10/2005 Hata ............................... 257/79
2006/0086943 A1 * 4/2006 Wu et al. ......................... 257/98
2006/0094145 A1 * 5/2006 Otsuka et al. ................... 438/31
2006/0126688 A1 * 6/2006 Kneissl ...................... 372/43.01
2006/0244010 A1 * 11/2006 Saxler ........................... 257/194

* cited by examiner

*Primary Examiner* — Tom Thomas
*Assistant Examiner* — Eduardo A Rodela
(74) *Attorney, Agent, or Firm* — Birch, Stewart, Kolasch & Birch, LLP

(57) ABSTRACT

Disclosed are a nitride semiconductor light emitting device and a method for manufacturing the same. The nitride semiconductor light emitting device includes a first nitride layer, an active layer including at least one delta-doping layer on the first nitride layer through delta-doping, and a second nitride layer on the active layer.

21 Claims, 5 Drawing Sheets

NITRIDE SEMICONDUCTOR LIGHT-EMITTING DEVICE AND METHOD FOR MANUFACTURING THE SAME

BACKGROUND OF THE INVENTION

1. Field of the Invention

The present invention relates to a nitride semiconductor light-emitting device and a method for manufacturing the same.

2. Description of the Related Art

Conventional nitride semiconductors include, for example, a GaN nitride semiconductor. Such a GaN nitride semiconductor is used for an optical device of blue/green LEDs, and high-speed and high-power devices, such as MESFET and HEMT. In particular, the blue/green LEDs can be manufactured in mass-production and have been increasingly used in the world.

Especially, in the fields of the GaN nitride semiconductors, a semiconductor light-emitting device having a crystal layer where a group-II element, such as magnesium (Mg) or zinc (Zn), is doped in a region including Ga is spotlighted as a blue light-emitting device.

As shown in FIG. 1, such a GaN nitride semiconductor includes a light emitting device having a multi quantum well structure. This light emitting device is generally grown on a substrate 1 including sapphire or SiC. In addition, a multi-crystalline layer, such as an $Al_yGa_{1-y}N$ layer, is grown from the sapphire substrate or the SiC substrate 1 as a buffer layer 2 in the low growth temperature and a GaN under layer 3 is sequentially deposited on the buffer layer 2 in the high temperature condition. An active layer 4 is aligned on the GaN under layer 3 for the purpose of light emission, and an AlGaN electronic barrier layer 5 doped with magnesium Mg and converted into a p-type through an annealing process, an InGaN layer 6 doped with magnesium, and a GaN layer 7 doped with magnesium are sequentially deposited on the active layer 4.

In addition, insulating layers are formed on the GaN layer 7 doped with magnesium and the GaN under layer 3. In addition, a P-electrode 9 and an N-electrode 10 are formed on the GaN layer 7 doped with magnesium and the GaN under layer 3, respectively, thereby forming the light emitting device.

The buffer layer adopted to realize the nitride light emitting device or an optical device, such as a laser device, may attenuate stress between the substrate and a layer grown on the substrate, so the buffer layer including GaN or AlGaN is grown on the substrate including SiC or Si.

However, since the lattice constant of the buffer layer is greatly different from that of the substrate, lattice defects, such as dislocation or vacancy, may occur between the buffer layer and the substrate or between the buffer layer and a layer formed on the buffer layer.

Although such dislocation, defects and an electronic field formed in crystal are disadvantageous to the light emitting device, the nitride semiconductor material is spotlighted as a material for the high-power light emitting device due to quantum dots formed in the InGaN and GaN epitaxial layer used as an active layer. Such quantum dots may laterally confine or localize the carrier (electrons and holes), thereby significantly reducing a bad influence derived from the dislocation or electronic field.

In detail, in the active layer having the quantum well structure, electrons in the conduction band and holes in the valence band are defined within the quantum dot, so that the density of state of the electrons and holes existing in the quantum dot may increase, thereby effectively increasing recombination efficiency between electrons and holes.

In order to form such a quantum dot, the active layer of the conventional nitride semiconductor light emitting device includes indium (In). At this time, the content of indium (In) is about 14% to about 18%. In order to increase the content of indium (In), a method of lowering the growth temperature for the active layer or a method of increasing an amount of indium (In) has been suggested. However, if the growth temperature for the active layer is lowered, the crystalline quality of the active layer is significantly degraded, exerting bad influence upon the reliability of the light emitting device. In addition, if the amount of indium (In) is increased, segregation of indium (In) and phase separation may occur. Especially, in the case of the multi quantum well structure, defect may occur at the interfacial layer formed between active layers, so that the reliability of the active layer is significantly degraded.

Thus, it is very important for improving light emitting efficiency of the nitride semiconductor light emitting device to develop technologies capable of controlling the quantum dot of the active layer.

SUMMARY OF THE INVENTION

The embodiment of the present invention provides a nitride semiconductor light emitting device and a method for manufacturing the same, capable of improving the light emitting efficiency of an active layer by controlling a size and distribution of quantum dots.

One embodiment of the invention provides a nitride semiconductor light emitting device comprising: a first nitride layer; an active layer including at least one delta-doping layer on the first nitride layer through delta-doping; and a second nitride layer on the active layer.

Another embodiment of the invention provides a method of manufacturing a nitride semiconductor light emitting device, the method comprising the steps of: forming a first nitride layer on a substrate; forming an active layer including at least one delta-doping layer on the first nitride layer through delta-doping; and forming a second nitride layer on the active layer.

DETAILED DESCRIPTION OF THE INVENTION

Hereinafter, a nitride semiconductor light emitting device and a method for manufacturing the same according to exemplary embodiments of the present invention will be explained in detail with reference to accompanying drawings.

In the following description, the expression "on/under each layer" may include the meaning of both "directly on/under each layer" and "indirectly on/under each layer".

In addition, although the embodiments of the present invention will be described in relation to a light emitting device including an active layer having a multi quantum well (MQW) structure, the present invention is not limited thereto.

Embodiment 1

FIGS. 2 to 6 are sectional views showing the procedure for manufacturing a nitride semiconductor light emitting device according to a first embodiment of the present invention.

Figure 1:
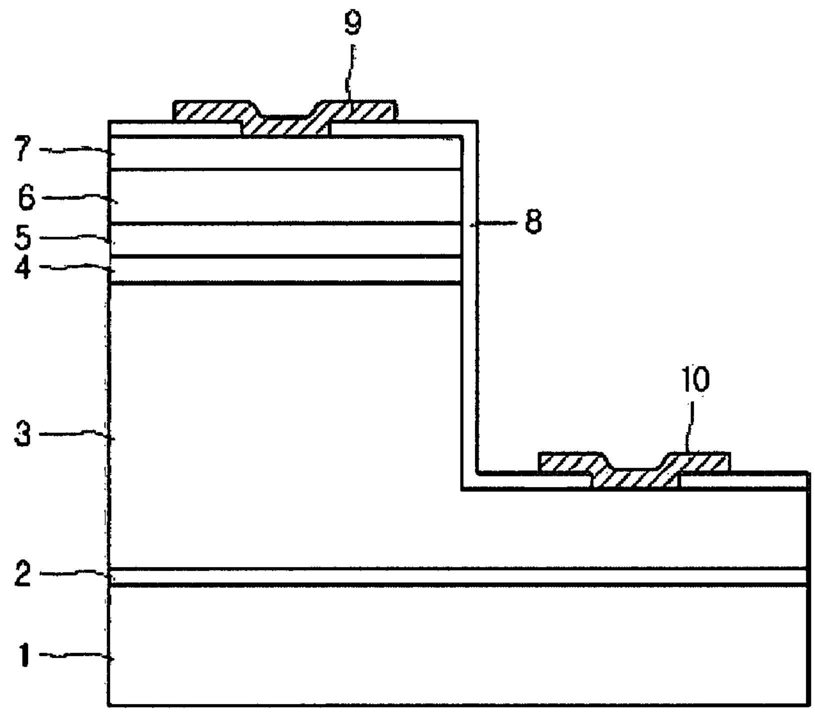
FIG. 1 is a sectional view of a conventional nitride semiconductor light emitting device.
Figure 2:
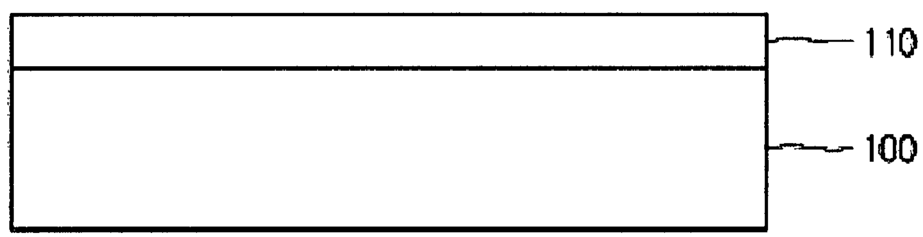
FIGS. 2 to 6 are sectional views showing the procedure for manufacturing a nitride semiconductor light emitting device according to a first embodiment of the present invention.

FIG. 2 is a sectional view showing a buffer layer 110 formed on a substrate 100 including sapphire, SiC or Si in the process of forming the nitride semiconductor light emitting device according to the first embodiment of the present invention. The buffer layer 110 includes an InGaN buffer layer, but the present invention is not limited thereto.

In order to form the InGaN buffer layer 110 on the substrate 100 as shown in FIG. 2, for example, the substrate 100 is loaded on a MOCVD reactor (not shown) and then the InGaN buffer layer 110 having composition of $In_{(x)}Ga_{(1-x)}N$ ($0<x<1$) is formed on the substrate 100 in the temperature range of about 500° C. to about 600° C.

Figure 3:
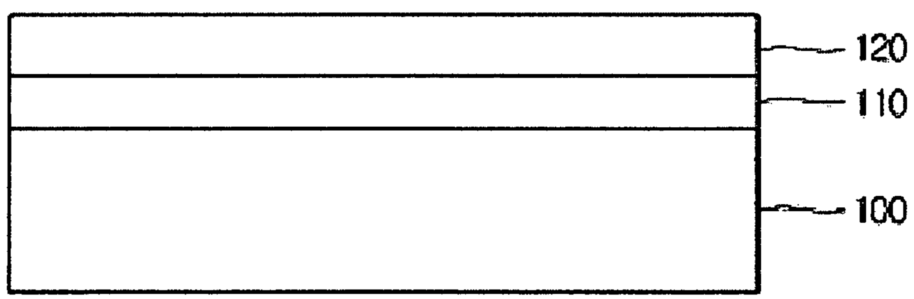

Then, as shown in FIG. 3, $NH_3$ ($4.0\times10^{-2}$ mol/min) and tri metal gallium (TMG) ($1.0\times10^{-4}$ mol/min) are fed onto the InGaN layer 110 at the growth temperature range of about 600° C. to about 800° C., thereby forming an undoped-GaN layer 120 having a predetermined thickness on the InGaN buffer layer 110.

Figure 4A:
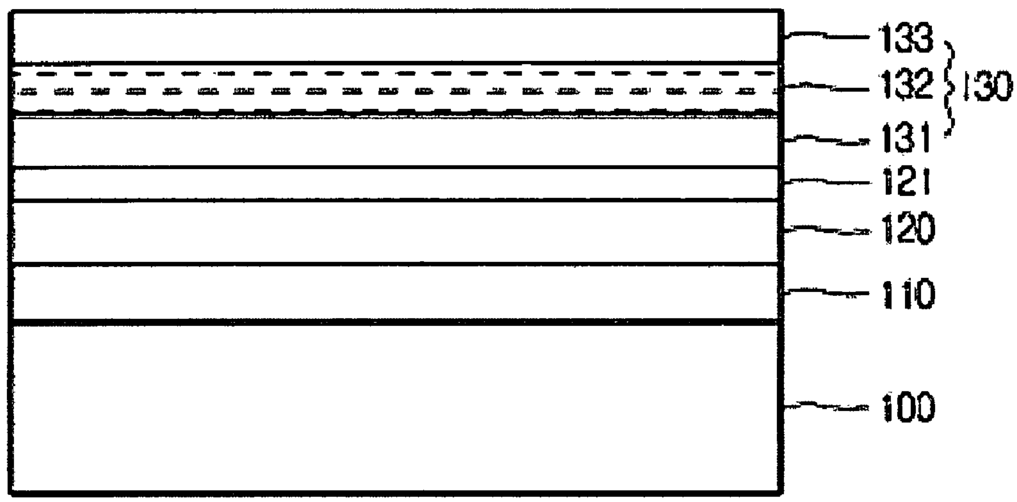

After that, as shown in FIG. 4A, a first n-GaN layer 121 including n-type dopant is formed on the undoped-GaN layer 120.

The first n-GaN layer 121 having the predetermined thickness can be obtained by feeding $NH_3$ ($3.7\times10^{-2}$ mol/min), TMGa ($1.2\times10^{-4}$ mol/min) and silane gas ($6.3\times10^{-9}$ mol/min) including n-type dopant, such as Si, in the hydrogen atmosphere having the growth temperature of about 1000° C. to about 1050° C.

After that, an active layer 130 is formed on the first n-GaN layer 121.

For instance, $NH_3$, TMGa, and tri methyl indium (TMIn) are fed onto the first n-GaN layer 121 in a predetermined growth temperature by using nitrogen as carrier gas, thereby growing an InGaN well layer 131 having a predetermined thickness on the first n-GaN layer 121. Then, after stopping supply of TMGa for about 5 seconds to about 10 seconds, indium (In) is delta-doped together with nitrogen and $NH_3$ gas for about 30 seconds to about 60 seconds, thereby forming a delta doping layer 132 on the InGaN well layer 131.

The growth temperature for the delta doping layer 132 is higher than the growth temperature for the InGaN well layer 131 by about 50° C. to about 100° C. Since the delta doping layer 132 is grown under the growth temperature higher than the growth temperature for the InGaN well layer 131 by about 50° C. to about 100° C., defects between active layers can be reduced.

Then, a GaN barrier layer 133 having a thickness of about 15 nm to about 20 nm is grown on the delta-doping layer 132, thereby forming the one-periodic active layer 130 including the delta-doping layer 132.

That is, according to the first embodiment of the present invention, the active layer can be formed with a plurality of quantum dots without causing lattice defect by doping indium (In) with the content of 20% or more, thereby obtaining the nitride semiconductor light emitting device having the improved light efficiency.

Figure 4B:
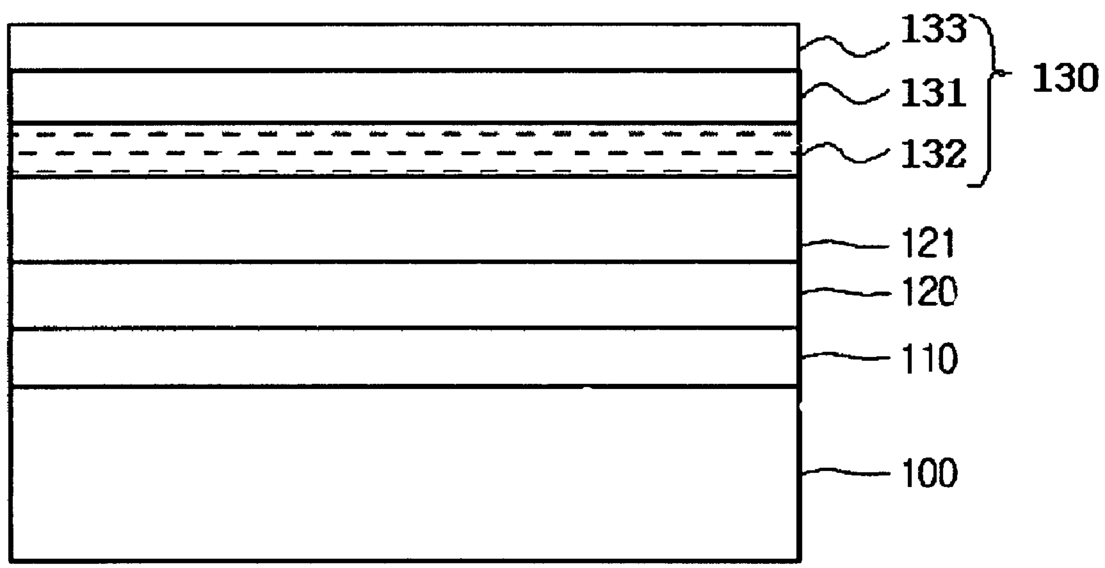

Although the first embodiment has been described in the one-periodic active layer 130 is obtained by sequentially forming the InGaN well layer 131, the delta doping layer 132, and the GaN barrier layer 133, the one-periodic active layer 130 can also be obtained by sequentially forming the delta doping layer 132, the InGaN well layer 131, and the GaN barrier layer 133 as shown in FIG. 4B.

Figure 4C:
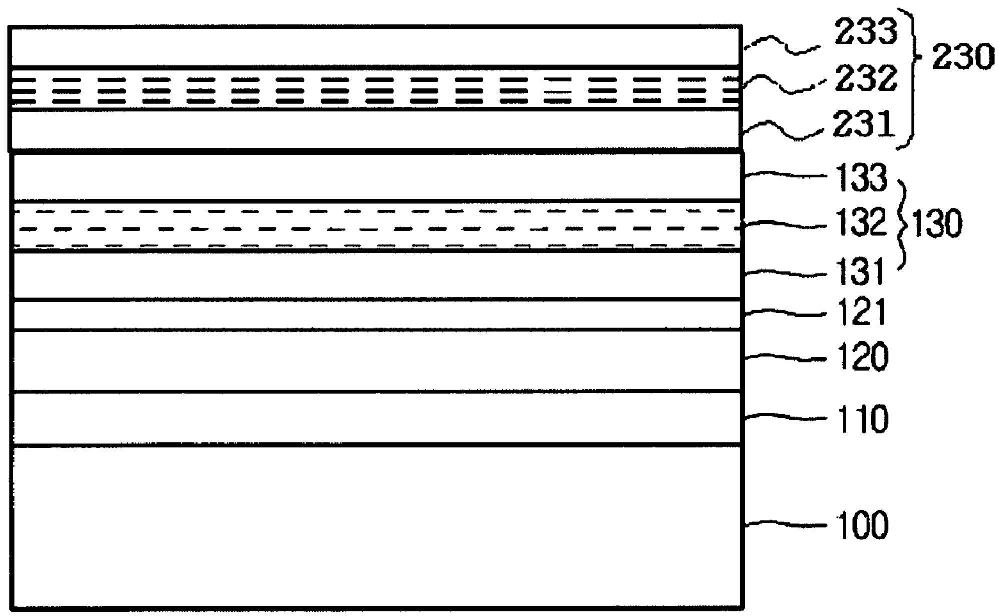

In addition, different from the one-periodic stack structure as shown in FIGS. 4A and 4B, the active layer may have a multi-periodic stack structure as shown in FIG. 4C by sequentially forming a second InGaN well layer 231, a second delta doping layer 232, and a second GaN barrier layer 233 on the GaN barrier layer 133. If the active layer has the multi-periodic structure, the active layer can be formed with a plurality of quantum dots without causing lattice defect by doping indium (In) with the content of 20% or more, thereby obtaining the nitride semiconductor light emitting device having the higher light efficiency.

Figure 5:
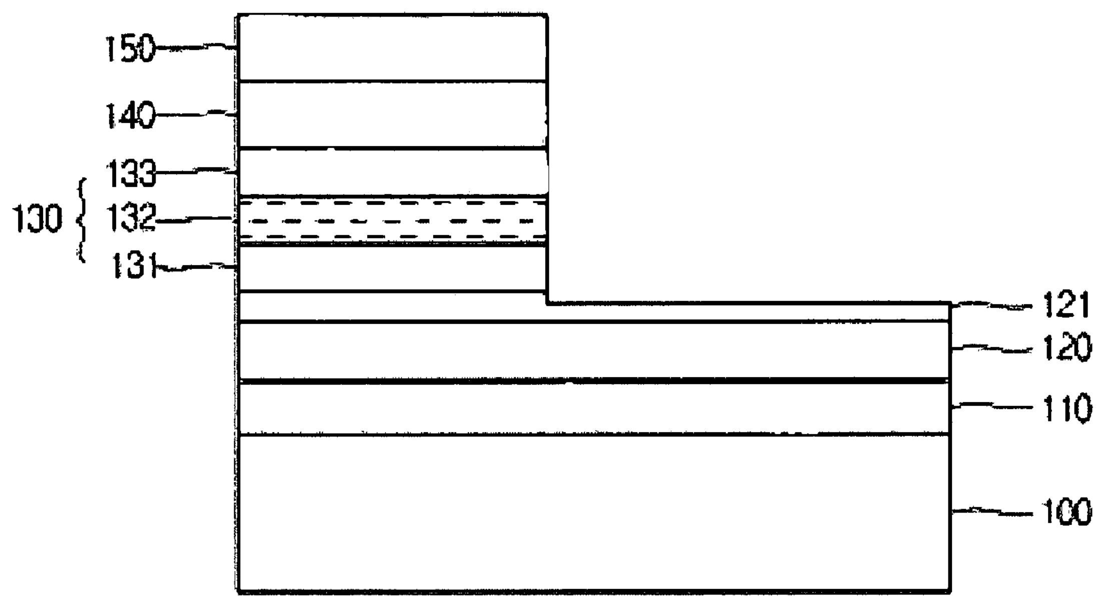

Next, as shown in FIG. 5, a P-type GaN layer 140 is formed on the active layer 130. In order to form the P-type GaN layer 140, for example, group-II elements, such as Mg-based elements, can be employed.

After the P-type GaN layer 140 has been formed, an etching process is performed, so that the stack structure is partially removed from the P-type GaN layer 140 to the first n-GaN layer 121. Then, a P-type ohmic contact transparent electrode layer 150 is formed on the P-type GaN layer 140.

The P-type ohmic contact transparent electrode layer 150 is a transparent electrode layer formed through CVD (chemical vapor deposition) by using one selected from metal oxides consisting of ZnO, RuO, NiO, CoO, and ITO (Indium-Tin-Oxide) and serves as a photon path and a current spreader.

Figure 6:
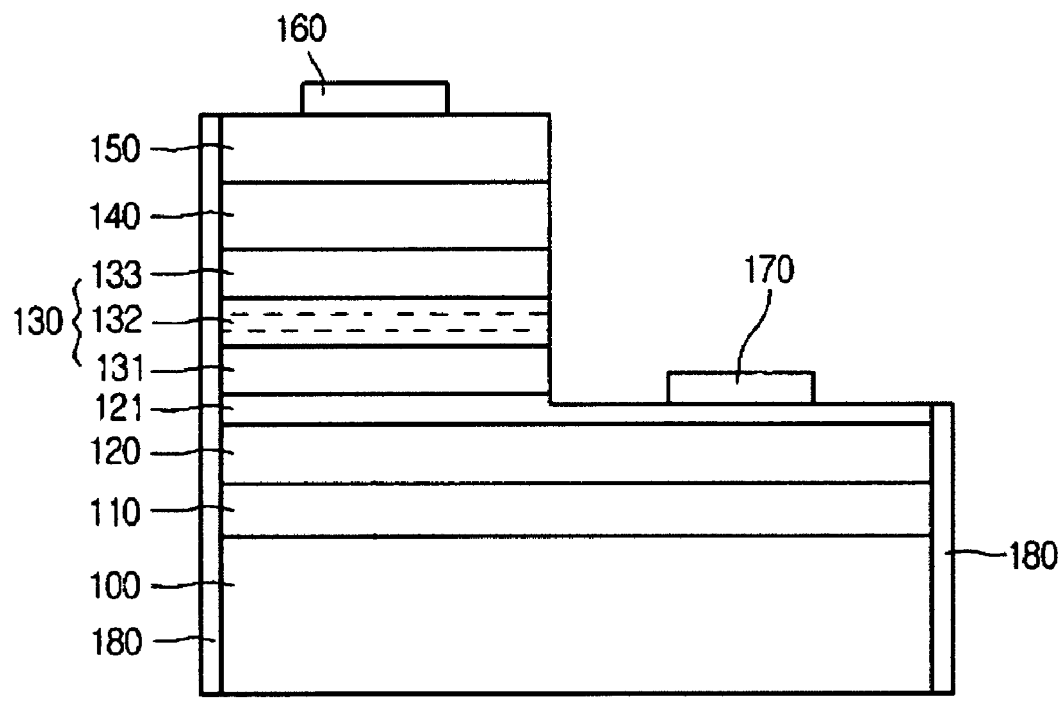

Then, as shown in FIG. 6, a P-type electrode pad 160 is formed on the P-type ohmic contact transparent electrode layer 150 and an N-type electrode pad 170 is formed on the exposed first n-GaN layer 121 to form electric contacts.

As shown in FIG. 6, the nitride semiconductor light emitting device according to the first embodiment of the present invention may further include a reflective layer 180 formed at one side or both sides of the stack structure including the substrate layer 100 and the P-type nitride layer 140.

The reflective layer 180 prevents light emitted from the active layer 130 from being absorbed in the light emitting device while being guided in the lateral direction of the light emitting device.

Embodiment 2

Figure 7:
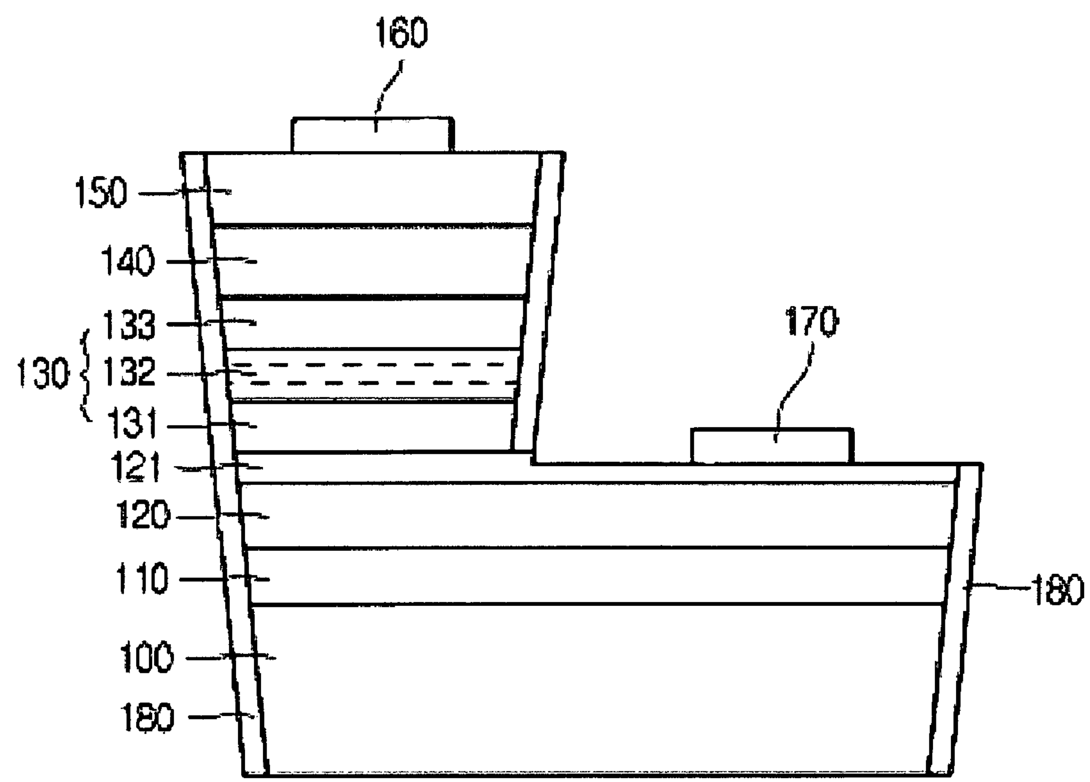
FIG. 7 is a sectional view showing a nitride semiconductor light emitting device according to a second embodiment of the present invention.

FIG. 7 is a sectional view showing a nitride semiconductor light emitting device according to a second embodiment of the present invention.

As shown in FIG. 2, according to the second embodiment of the present invention, at least one lateral surface of layers from the substrate 100 to the P-type nitride layer 140 is inclined at a predetermined angle and a reflective layer 180 is formed on the inclined lateral surface.

That is, according to the second embodiment of the present invention, one lateral surface or both lateral surfaces of the layers are etched at a predetermined angle to form the inclined lateral surfaces and the reflective layer 180 is formed on the inclined lateral surfaces, thereby preventing light emitted from the active layer 130 from being absorbed in the light emitting device while being guided in the lateral direction of the light emitting device.

The etching scheme employed to form the inclined lateral surface includes, for example, anisotropy wet etching. Preferably, the inclination angle of the inclined lateral surface is in a range about 10° to about 80° relative to the substrate 100. More preferably, the inclination angle is about 30°.

If the reflective layer 180 is formed on the inclined lateral surface, the light emitted from the active layer 130 can be reflected from the reflective layer 180, so that the external light efficiency of the light emitting device can be improved. Thus, degradation of the light efficiency occurring in the conventional nitride semiconductor light emitting device can be solved.

The reflective layer 180 includes a semiconductor layer having compounds based on $Al_xIn_yGaN/GaN$ ($0<x<1$ and $0<y<1$), and AlxInyGaN/GaN layers can be alternately deposited on the lateral surfaces of the light emitting device through the CVD process.

If the reflective layer 180 is formed by alternately depositing semiconductor compound layers, a desired reflective index can be obtained by adjusting the thickness and deposition period of the reflective layer 180. In addition, the surface roughness of the reflective layer 180 can be adjusted by changing the flow rate of carrier gas ($N_2$ or $H_2$) or $NH_3$, which is fed when depositing the reflective layer 180 including AlInGaN-based compound semiconductors, or by controlling the growth rate of the reflective layer 180.

In addition, a lower portion of the substrate 100 is subject to the lapping and polishing processes to reduce the total thickness of the light emitting device, and then a sawing process is performed so as to divide the resultant structure into individual light emitting device chips.

Figure 8:
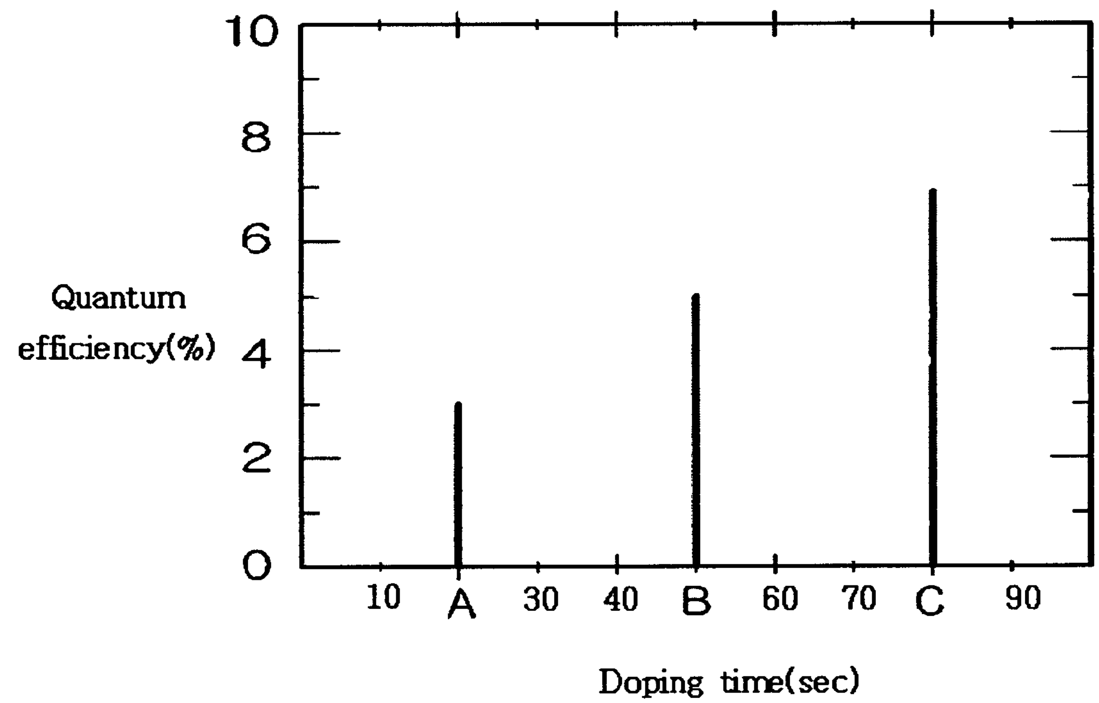
FIG. 8 is a graph showing the quantum efficiency as a function of delta doping time in a nitride semiconductor light emitting device according to an embodiment of the present invention.

FIG. 8 is a graph showing the quantum efficiency as a function of delta doping time in a nitride semiconductor light emitting device according to an embodiment of the present invention.

Referring to FIG. 8, the delta-doping time of “A” is about 10 seconds to about 30 seconds, the delta-doping time of “B” is about 30 seconds to about 60 seconds, and the delta-doping time of “C” is greater than 60 seconds.

As can be understood from FIG. 8, the nitride semiconductor light emitting device manufactured through the above procedure according to the present invention exhibits the improved quantum efficiency as the delta-doping time of indium (In) increases.

Figure 9:
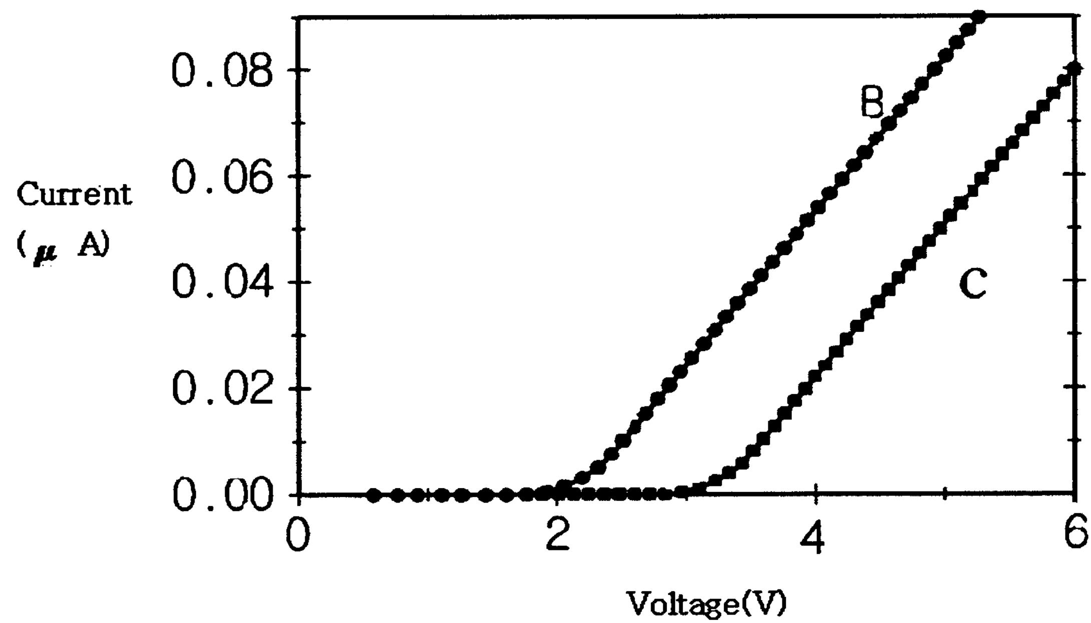
FIG. 9 is a graph showing a turn-on voltage as a function of delta-doping time in a nitride semiconductor light emitting device according to an embodiment of the present invention.

FIG. 9 is a graph showing a turn-on voltage as a function of delta-doping time in a nitride semiconductor light emitting device according to an embodiment of the present invention.

In FIG. 9, the delta-doping time of “B” is about 30 seconds to about 60 seconds, and the delta-doping time of “C” is greater than 60 seconds.

As shown in FIG. 9, the turn-on voltage, which is an electric characteristic of the light emitting device, may increase as the delta-doping time increases.

Thus, the nitride semiconductor light emitting device according to the present invention can obtain optimal characteristics by delta-doping indium (In) into the active layer 130 for about 30 seconds to about 60 seconds.

If indium (In) is delta-doped into the active layer 130 according to the present invention, the crystalline quality or the surface state of the active layer 130 cannot be degraded by indium (In) and the active layer 130 can be formed with a plurality of quantum dots (not shown), so that the light efficiency of the light emitting device can be improved.

Such quantum dots may laterally confine or localize the carriers, such as electrons and holes, thereby significantly reducing a bad influence derived from the dislocation or electronic field.

According to the related art, it is difficult to increase the content of indium (In) to a level of more than 20%. Even if the content of indium (In) can be increased to a level of more than 20%, crystalline defects such as segregation or dislocation of indium (In) may occur, so that the crystalline quality and the surface roughness of the active layer may be degraded.

If the light emitting device is manufactured by forming the p-GaN layer on the active layer having the poor crystalline quality and surface roughness, the light efficiency of the light emitting device is significantly lowered and resistance is increased.

However, if the delta-doping method according to the present invention is employed for the light emitting device, indium (In) can be doped with the content of more than 20% and the crystalline quality and the surface roughness of the active layer can be improved. In addition, if the delta-doping method is employed, the active layer can be grown in the growth temperature higher than that of the InGaN layer by about 50° C. to about 100° C., so that the active layer 130 can be grown with superior crystalline quality.

Further, according to an embodiment of the present invention, the reflective layer 180 is formed on the inclined lateral surface, so that light emitted from the active layer 130 is reflected from the reflective layer 180 toward the P-type electrode 160 of the light emitting device. Thus, degradation of the light efficiency occurring in the conventional nitride semiconductor light emitting device caused by total reflection can be solved. In addition, since the active layer is provided with a plurality of quantum dots, which are formed by delta-doping indium (In), the light efficiency of the light emitting device can be further improved.

Although the present invention has been described in relation to the semiconductor light emitting device having the P-N structure, the active layer of the present invention can also be applied to the semiconductor light emitting device having the NPN structure, in which an N-type semiconductor layer is formed on a P-type semiconductor layer.

As described above, according to the nitride semiconductor light emitting device and the method for manufacturing the same, the active layer is formed with a plurality of quantum dots without causing the lattice defect by delta-doping indium (In), so that the light efficiency of the nitride semiconductor light emitting device can be improved.

In addition, according to the present invention, the reflective layer is formed on the inclined lateral surface, so that degradation of the light efficiency caused by total reflection can be prevented, thereby improving the reliability of the nitride semiconductor light emitting device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A nitride semiconductor light emitting device, comprising:

a first nitride layer;

an active layer on the first nitride layer, the active layer including an InGaN well layer, at least one delta-doping layer that indium (In) is delta-doped into the InGaN well layer, and a GaN barrier layer; and a second nitride layer on the active layer, wherein the at least one delta-doping layer contains more indium nitride (InN) than the InGaN well layer.

2. The nitride semiconductor light emitting device as claimed in claim 1, wherein the active layer has a multi-stack structure including the at least one delta-doping layer and at least one InGaN layer adjacent to the at least one delta-doping layer.

3. The nitride semiconductor light emitting device as claimed in claim 1, wherein the active layer is prepared as at least one-periodic active layer, and the one-periodic active layer includes:

the InGaN well layer on the first nitride layer;

the at least one delta-doping layer on the InGaN well layer; and the GaN barrier layer on the at least one delta-doping layer.

4. The nitride semiconductor light emitting device as claimed in claim 3, wherein the GaN barrier layer has a thickness of about 15 nm to about 20 nm.

5. The nitride semiconductor light emitting device as claimed in claim 1, wherein the active layer is prepared as at least one-periodic active layer, and the one-periodic active layer includes:

the at least one delta-doping layer on the first nitride layer;

the InGaN well layer on the at least one delta-doping layer; and the GaN barrier layer on the InGaN well layer.

6. The nitride semiconductor light emitting device as claimed in claim 5, wherein the GaN barrier layer has a thickness of about 15 nm to about 20 nm.

7. The nitride semiconductor light emitting device as claimed in claim 1, wherein the first nitride layer includes at least one n-type nitride layer and the second nitride layer includes at least one p-type nitride layer.

8. The nitride semiconductor light emitting device as claimed in claim 1, further comprising:

a reflective layer on at least one side surface of layers forming the light emitting device.

9. The nitride semiconductor light emitting device as claimed in claim 8, wherein the at least one side surface is inclined at a predetermined inclination angle.

10. The nitride semiconductor light emitting device as claimed in claim 9, wherein the predetermined inclination angle is in a range of about 10° to about 80° relative to a substrate.

11. The nitride semiconductor light emitting device as claimed in claim 8, wherein the reflective layer includes a semiconductor layer having compounds based on $Al_xIn_yGaN/GaN$ ($0 \leqq x \leqq 1$, $0 \leqq y \leqq 1$).

12. The nitride semiconductor light emitting device as claimed in claim 11, wherein the AlxInyGaN/GaN layers are alternately deposited on the lateral surfaces of the light emitting device.

13. The nitride semiconductor light emitting device as claimed in claim 1, further comprising:

a buffer layer under the first nitride layer.

14. The nitride semiconductor light emitting device as claimed in claim 13, wherein the buffer layer comprises an InGaN buffer layer.

15. The nitride semiconductor light emitting device as claimed in claim 1, wherein the active layer is formed by doping indium (In) with the content of 20% or more.

16. The nitride semiconductor light emitting device as claimed in claim 1, wherein the active layer is formed with a plurality of quantum dots without causing lattice defect by doping indium (In) with the content of 20% or more.

17. The nitride semiconductor light emitting device as claimed in claim 1, further comprising:

a P-type ohmic contact transparent electrode layer over the second nitride layer.

18. The nitride semiconductor light emitting device as claimed in claim 17, wherein the P-type ohmic contact transparent electrode layer is formed by using one selected from metal oxides consisting of ZnO, RuO, NiO, CoO, and ITO (Indium-Tin-Oxide).

19. The nitride semiconductor light emitting device as claimed in claim 1, wherein the at least one delta doping layer comprises at least one InN layer.

20. A nitride semiconductor light emitting device, comprising:

a first nitride layer;

an active layer on the first nitride layer, the active layer including an InGaN well layer, at least one nitride layer that indium (In) is delta-doped into the InGaN well layer, and a GaN barrier layer; and a second nitride layer on the active layer, wherein the at least one nitride layer of the active layer contains more indium nitride (InN) than the InGaN well layer.

21. The nitride semiconductor light emitting device as claimed in claim 20, wherein the at least one nitride layer of the active layer comprises at least one InN layer.

* * * * *